United States Patent
Nojima et al.

(10) Patent No.: US 8,683,422 B2
(45) Date of Patent: Mar. 25, 2014

(54) SUPPORT APPARATUS AND INFORMATION PROCESSING METHOD THEREOF

(75) Inventors: Toshitaka Nojima, Kawasaki (JP); Koji Hirai, Yokohama (JP); Shinichi Hama, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/315,491

(22) Filed: Dec. 9, 2011

(65) Prior Publication Data

US 2012/0159411 A1 Jun. 21, 2012

(30) Foreign Application Priority Data

Dec. 20, 2010 (JP) .................. 2010-283735

(51) Int. Cl.
*G06F 17/50* (2006.01)
(52) U.S. Cl.
USPC .......................................... 716/137; 716/136
(58) Field of Classification Search
USPC ....................................................... 716/137
See application file for complete search history.

(56) References Cited

U.S. PATENT DOCUMENTS

| 2002/0151200 A1* | 10/2002 | Fauser et al. .................. 439/181 |
| 2005/0005253 A1* | 1/2005 | Strickland et al. ................ 716/5 |
| 2009/0189194 A1* | 7/2009 | Schroeder et al. ............. 257/203 |
| 2011/0007485 A1 | 1/2011 | Hirai ............................. 361/753 |

FOREIGN PATENT DOCUMENTS

JP 2005-235592 9/2005

* cited by examiner

*Primary Examiner* — Paul Dinh
*Assistant Examiner* — Bryce Aisaka
(74) *Attorney, Agent, or Firm* — Fitzpatrick, Cella, Harper & Scinto

(57) ABSTRACT

Layout information indicating a layout of circuits on a print circuit board is obtained. With reference to the layout information, a connection portion, which electrically connects a ground pattern of the print circuit board and an external ground of the print circuit board, is specified, and a pin, which is included in a connector laid out on the print circuit board and is connected to the ground pattern, is identified. Then, a discharge route between the pin and connection portion is determined.

9 Claims, 16 Drawing Sheets

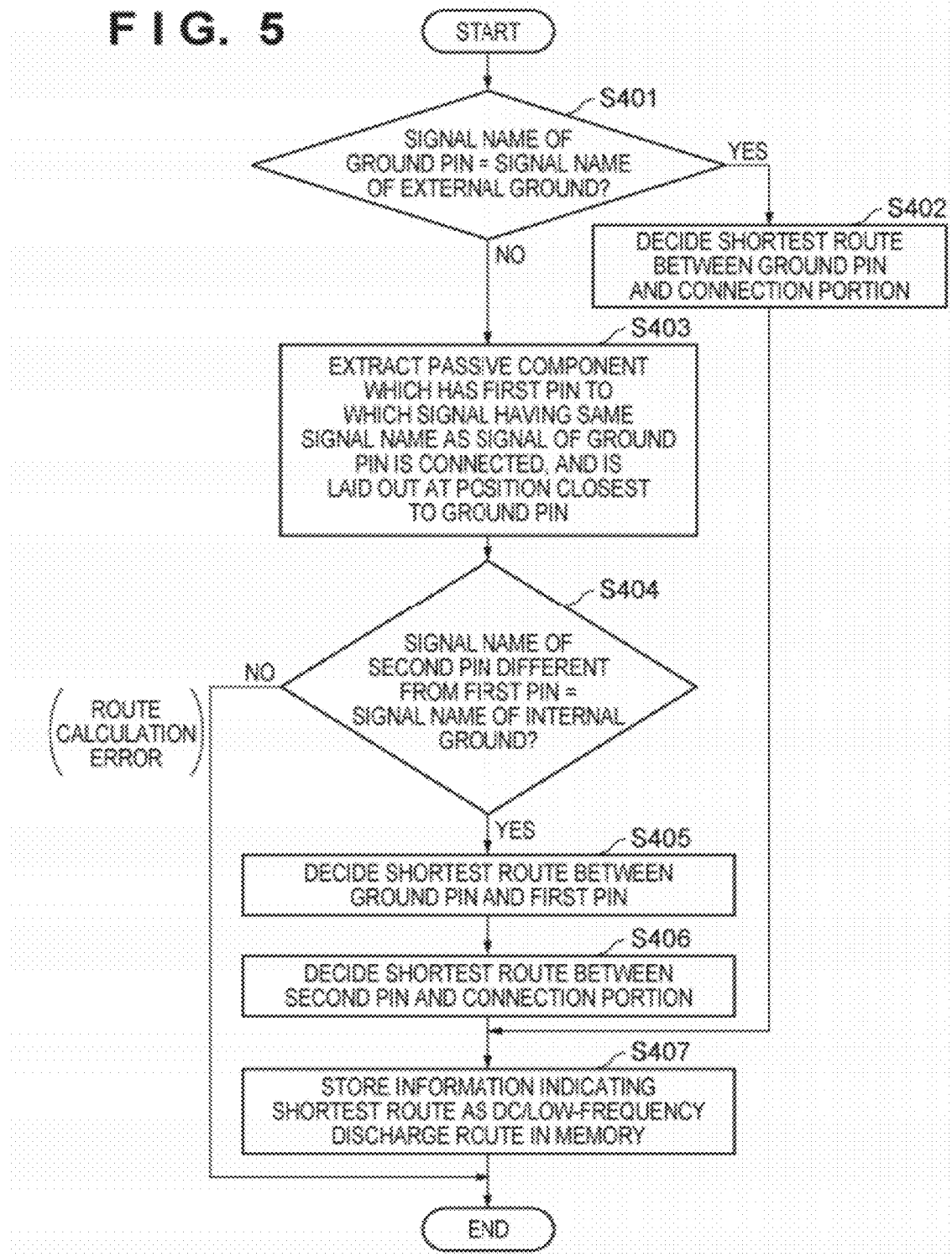

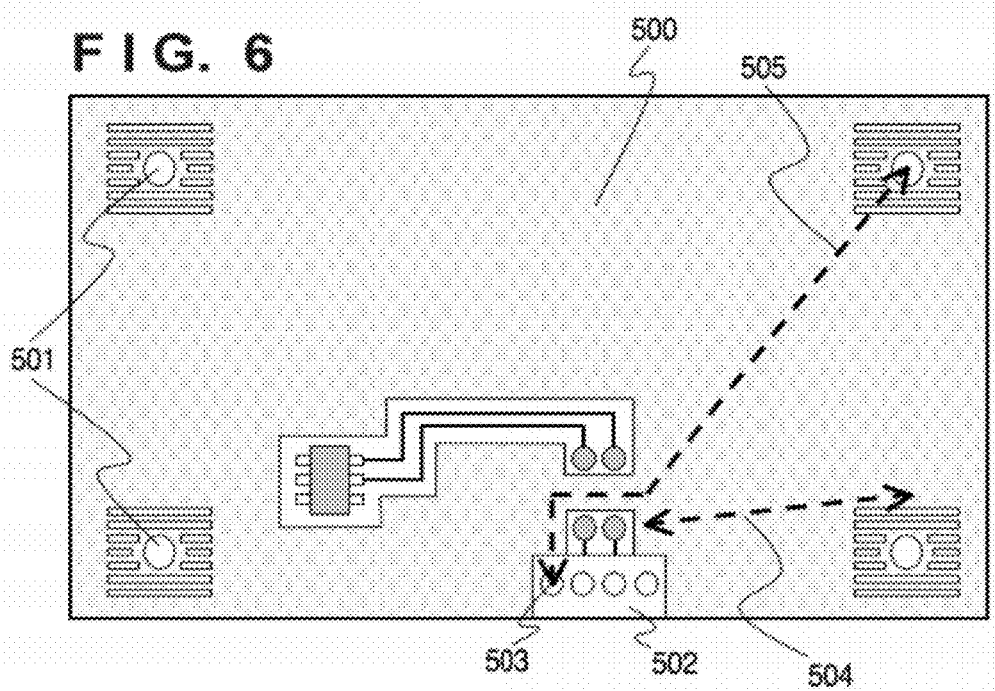
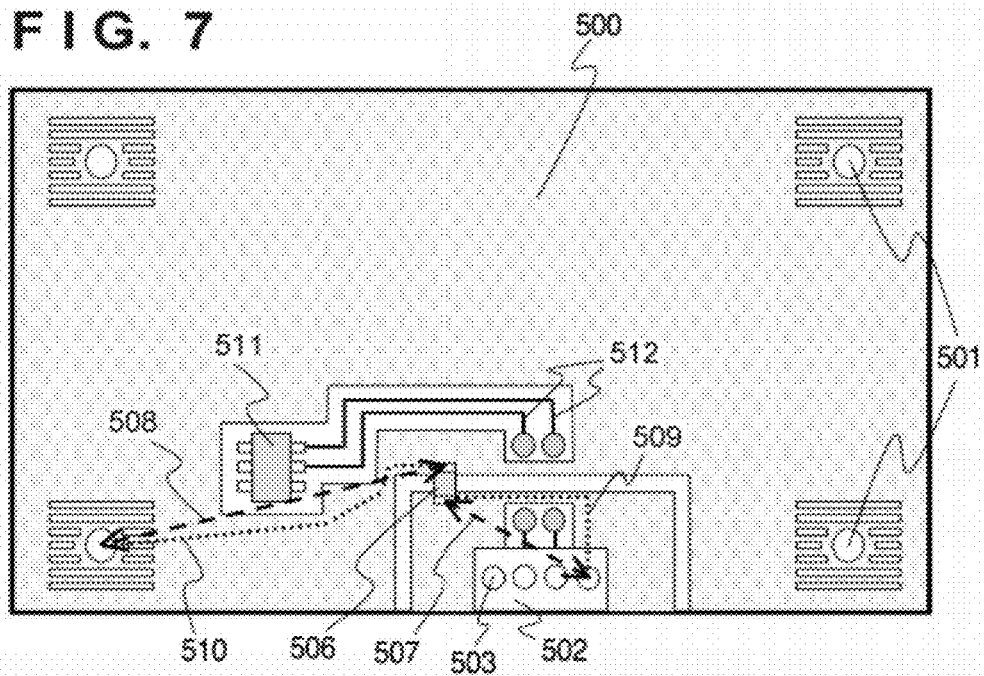

| TARGET CONNECTOR | COMPONENT OF DETERMINATION NG | SIGNAL NAME OF DETERMINATION NG | WIRING LENGTH (mm) IN DISCHARGE ROUTE |
|---|---|---|---|
| CN001 | IC1 | — | — |
| CN001 | — | NET_A | 3.2 |

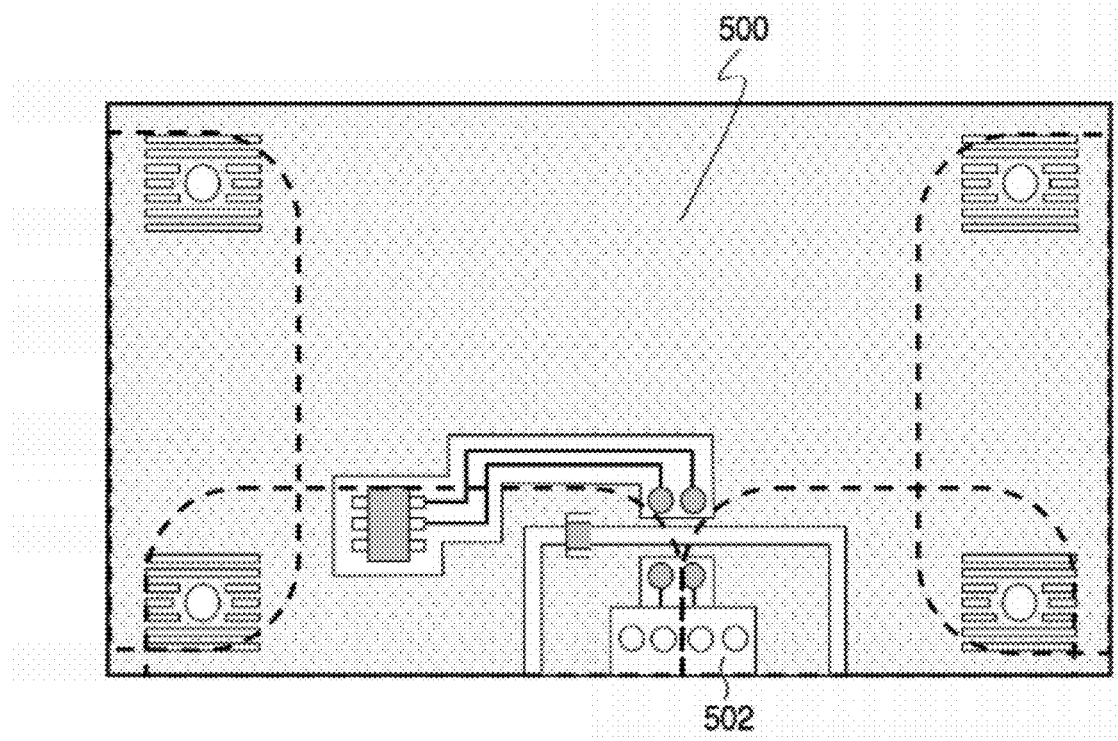
F I G. 18

| TARGET CONNECTOR | COMPONENT OF DETERMINATION NG | SIGNAL NAME OF DETERMINATION NG | WIRING LENGTH (mm) IN DISCHARGE ROUTE |
|---|---|---|---|
| CN001 | IC1 | — | — |
| CN001 | — | NET_A | 15.2 |
| CN001 | — | NET_B | 15.8 |

SUPPORT APPARATUS AND INFORMATION PROCESSING METHOD THEREOF

BACKGROUND OF THE INVENTION

1. Field of the Invention

The present invention relates to a design support apparatus of a print circuit board, and an information processing method thereof.

2. Description of the Related Art

For example, when a user of electronic equipment touches a connector of the electronic equipment, static electricity charged on a human body and the like is discharged, and flows into an electronic circuit on a print circuit board. Such discharge phenomenon of static electricity will be referred to as "electrostatic noise" hereinafter. As is known, the electrostatic noise causes damages and malfunctions of an integrated circuit (IC) and large-scale integrated circuit (LSI). In the following description, a semiconductor IC and LSI will be collectively referred to as an IC.

As a method of verifying malfunctions of electronic equipment caused by electrostatic noise, an electrostatic discharge immunity test is conducted after assembling of the electronic equipment. When malfunctions have occurred in the electrostatic discharge immunity test, a measure for adding countermeasure components such as a sheet metal, and a measure for changing component layouts and conductive patterns by tracing back to a layout design stage of a print circuit board are taken. However, addition of countermeasure components such as a sheet metal increases product cost, and a development period is prolonged when the stage is traced back to the layout design stage of the print circuit board.

SUMMARY OF THE INVENTION

In one aspect, an apparatus for supporting design of a print circuit board, comprising: an obtaining section, configured to obtain layout information indicating a layout of circuits on the print circuit board; a specifying section, configured to specify a connection portion, which electrically connects a ground pattern of the print circuit board and an external ground of the print circuit board, with reference to the layout information; an identifying section, configured to identify a pin, which is included in a connector laid out on the print circuit board, and is connected to the ground pattern, with reference to the layout information; and a first determiner, configured to determine a discharge route between the pin and the connection portion.

According to the aspect, the influences of electrostatic noise can be verified in a design stage of a print circuit board.

Further features of the present invention will become apparent from the following description of exemplary embodiments with reference to the attached drawings.

BRIEF DESCRIPTION OF THE DRAWINGS

FIG. 5 is a flowchart for explaining processing of a discharge route calculation unit.

FIGS. 6 and 7 are views for explaining examples of a shortest route decision method.

FIGS. 17 and 18 are views showing other examples of discharge routes of high-frequency AC components.

DESCRIPTION OF THE EMBODIMENTS

A design support apparatus and information processing thereof according to embodiments of the present invention will be described in detail hereinafter with reference to the drawings.

First Embodiment

Apparatus Arrangement

Figure 1:
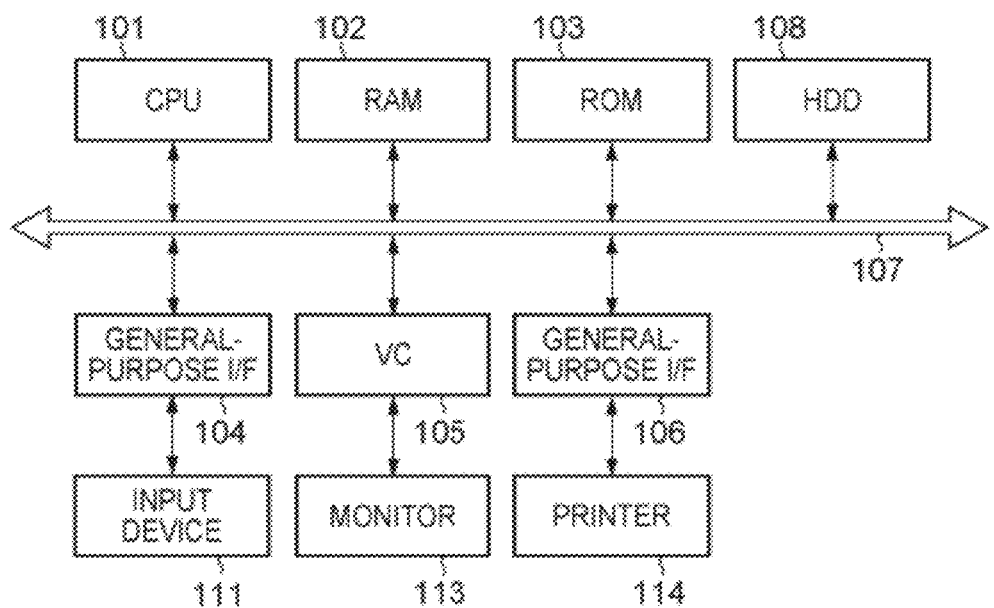
FIG. 1 is a block diagram for explaining the arrangement of a computer apparatus used to execute design support processing.

The arrangement of a computer apparatus used to execute design support processing of an embodiment will be described below with reference to the block diagram shown in FIG. 1.

A CPU (microprocessor) 101 executes various programs, which are stored in nonvolatile memories such as a ROM (Read Only Memory) 103 and HDD (Hard Disk Drive) 108, and include an OS (Operating System), using a RAM (Random Access Memory) 102 as a work memory, and controls respective units (to be described later) via a system bus 107. Various programs stored in the HDD 108 include a print circuit board design support program (to be described later).

A general-purpose I/F (Interface) 104 is, for example, a serial bus interface such as USB (Universal Serial Bus), and is used to connect an input device 111 such as a mouse and keyboard. A VC (Video Card) 105 is a video interface, and is used to connect a monitor 113 such as a liquid crystal device (LCD). A general-purpose I/F 106 is, for example, a serial bus interface such as USB, and is used to connect an output device such as a printer 114. Note that the general-purpose I/Fs 104 and 106 can be combined into one interface.

The CPU 101 displays a UI (User Interface) on the monitor 113. The user inputs instructions and data to the UI by operating the input device 111. The CPU 101 inputs user instructions and data from the input device 111, and executes programs according to these inputs, thus implementing various kinds of processing.

The HDD 108 stores a CAD (Computer Aided Design) program required to design a print circuit board, layout information of circuits associated with the print circuit board (to be referred to as layout information hereinafter), and information associated with components mounted on the print circuit board (to be referred to as component information hereinafter). Note that the CPU 101 can store the program and information in the HDD 108 by loading them from various recording media using a disk drive and card reader (neither are shown), or obtaining them from a server apparatus via a network (not shown).

Layout Information

The layout information includes the following pieces of information, but they are not always indispensable. The layout information includes:

information associated with a layer configuration of a print circuit board;

reference designator information of components mounted on the print circuit board (to be referred to as mounted components hereinafter);

mount coordinates of the mounted components;

shapes of the mounted components;

mounted component information (mount coordinates and shapes of pins (terminals) of the mounted components, shapes and signal names of conductor portions to which the pins (terminals) are connected, and the like);

component number information (to be collated with component information) used to specify the mounted components;

signal names and wiring information (coordinates of points that configure wiring patterns, and the like) of inter-component wirings;

drill hole information (coordinates and shapes of drill holes, and the like);

metal exposure information (coordinates of points indicating metal exposure regions, and the like); and circuit board outline information (coordinates of points that configure an outline of the printed circuit board, and the like).

Component Information

The component information includes the following pieces of information and the like, but they are not always indispensable. Also, the component information can be obtained from a component database (DB) via a network. The component information includes:

component number information (information associated with components at the time of print circuit board design; used to specify numbers unique to components);

material information (indicating materials that configure components);

component name information (names such as "connector", "resistor", "IC", and the like); and pin information (indicating pins (terminals) such as a power supply pin, ground pin, input/output pin, and the like).

[Support Program]

Figure 2:
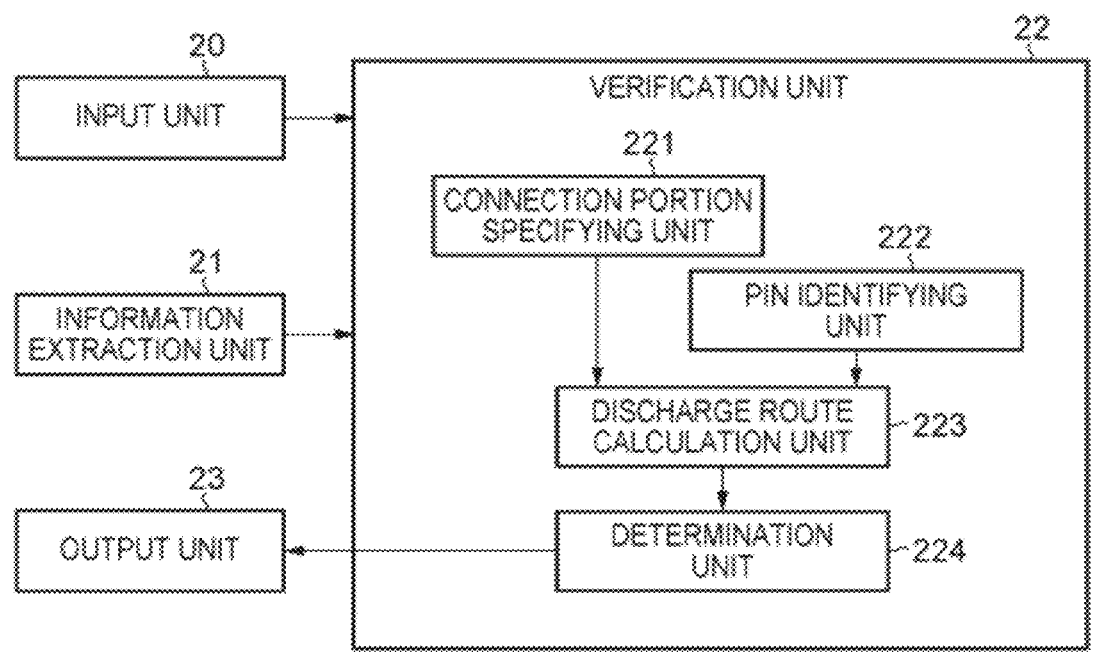
FIG. 2 is a block diagram for explaining the functional arrangement of a support program used to execute the design support processing.

The functional arrangement of a support program used to execute the design support program of this embodiment will be described below with reference to the block diagram shown in FIG. 2. The support program is a part of the CAD program required to design a print circuit board, and the functional arrangement shown in FIG. 2 is implemented when the CPU 101 executes the support program.

An input unit 20 inputs various instructions and data, which are input by the user by operating the input device 111, to a verification unit 22. When input instructions of the layout information and component information are issued via the input unit 20, an information extraction unit 21 reads out the instructed information from the HDD 108, and inputs the readout information to the verification unit 22.

The verification unit 22 determines a positional relationship among a discharge route of static electricity (to be also referred to as a conductive route hereinafter), and an active component (active element) such as an IC and a conductive pattern. A connection portion specifying unit 221 of the verification unit 22 specifies a position where a conductive connection member, which electrically connects a ground inside a print circuit board (internal ground) and that outside the print circuit board, is laid out (connection portion) based on the information input by the user. Note that the connection portion specifying unit 221 can also specify a connection portion from unit information of electronic equipment stored in the HDD 108 or an external DB.

A pin identifying unit 222 identifies a conductive pin (to be referred to as a ground pin) of a connector connected to the internal ground based on the layout information and component information input by the information extraction unit 21.

A discharge route calculation unit 223 calculates a discharge route of static electricity between the connection portion and ground pin with reference to the layout information input by the information extraction unit 21, the connection portion specified by the connection portion specifying unit 221, and the ground pin identified by the pin identifying unit 222.

A determination unit 224 determines with reference to the layout information input by the information extraction unit 21 whether or not an active component or conductive pattern is laid out within the discharge route calculated by the discharge route calculation unit 223. An output unit 23 outputs the determination result of the determination unit 224. Note that the output of the determination result includes, for example, display of the determination result on the monitor 113, recording of the determination result in a predetermined area of the HDD 108, and so forth. When it is determined that an active component or conductive pattern is laid out within the discharge route, the output unit 23 displays a warning message that advises accordingly on the monitor 113.

The overview of the functions implemented by the support program has been described. Details of processing to be executed by the support program will be described below.

Verification Processing

Figure 3:
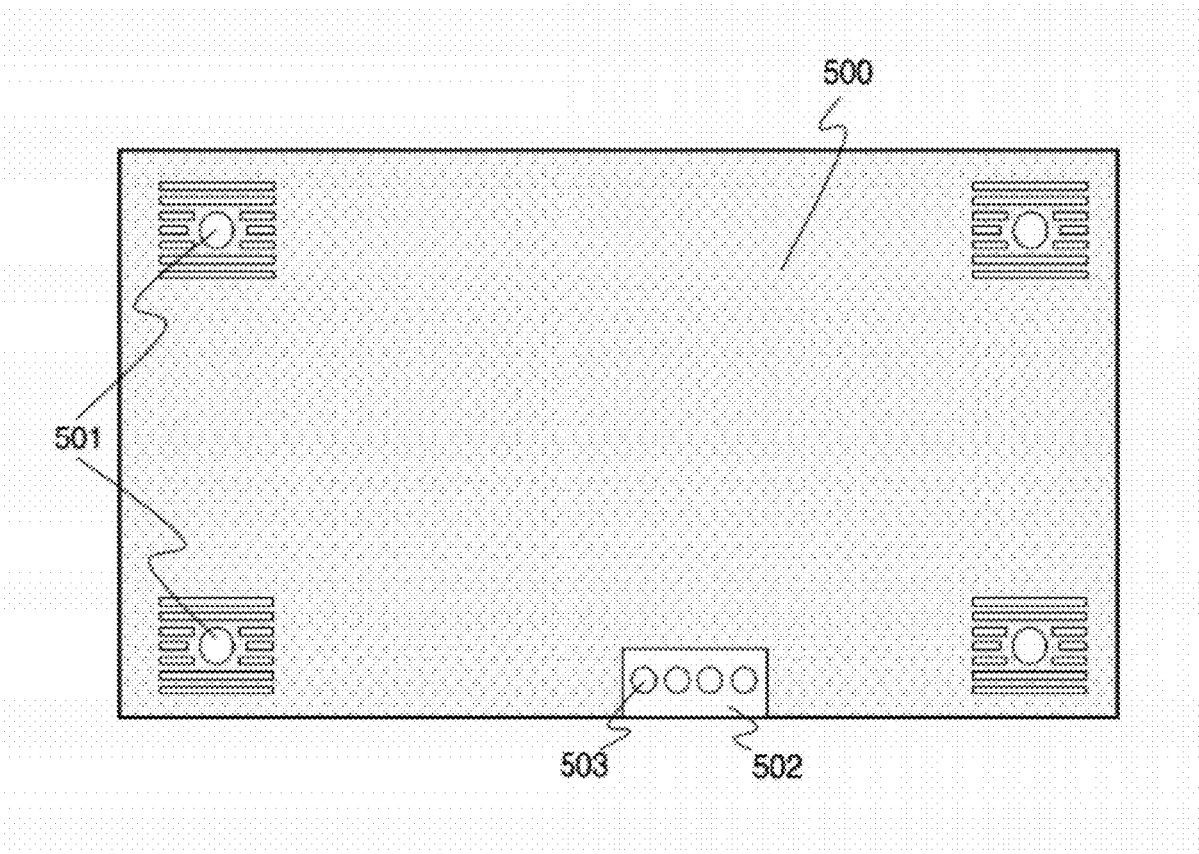
FIG. 3 shows an example of layout information of a print circuit board.

FIG. 3 shows an example of the layout information of a print circuit board. The design of the print circuit board shown in FIG. 3 is underway, and the layout information includes ground potential conductive pattern (to be referred to as ground pattern hereinafter) information 500, drill hole information 501, connector shape information 502, and mounted component information 503 indicating pins of a connector. That is, the layout information shown in FIG. 3 is that in a stage in which drill holes, a ground pattern, and a connector are laid out on the print circuit board. The layout information shown in FIG. 3 is displayed on the UI on the monitor 113 by the CAD program.

FIG. 3 shows a simple component layout and conductive pattern for the sake of simplicity. An actual print circuit board includes high-density and complicated component layouts and conductive patterns, but the following description will not exclude them.

Figure 4:
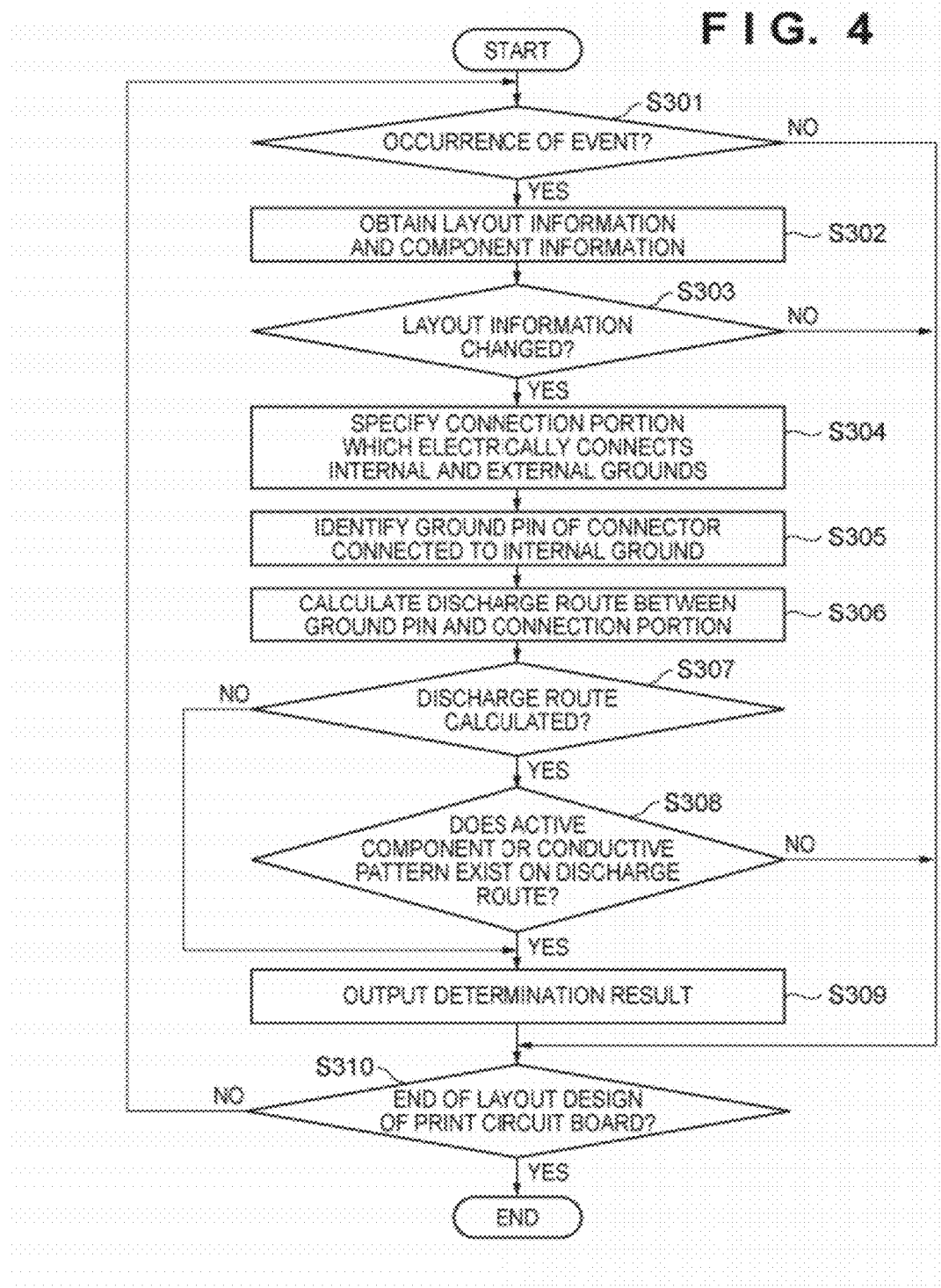
FIG. 4 is a flowchart for explaining processing of a verification unit.

The processing of the verification unit 22 will be described below using the flowchart shown in FIG. 4 with reference to the layout information shown in FIG. 3.

Upon reception of an execution instruction of verification processing via the input unit 20, the verification unit 22 determines occurrence of an event (S301). When the user inputs an instruction to the CAD program (to be described as "manipulates the CAD" hereinafter), the verification unit 22 determines that an event has occurred. The manipulation of the CAD includes a change in layout on the print circuit board. Note that the change in layout includes a layout of drill holes, that of components, wiring of signal routes, and a layout of a conductive pattern, changes of the layouts of drill holes, components, and conductive pattern, a change of wiring, and the like.

If no event occurs, the verification unit 22 controls the process to jump to step S310; if an event has occurred, the verification unit 22 instructs the information extraction unit 21 to obtain the layout information and component information (S302). The verification unit 22 determines whether or not the layout information has been changed (S303). If the layout information has not been changed, the verification unit 22 controls the process to jump to step S310. Note that whether or not the layout information has been changed can be determined with reference to, for example, a change history included in the layout information.

If the layout information has been changed, the verification unit 22 instructs the connection portion specifying unit 221 to specify a connection portion which electrically connects between the internal and external grounds (S304). The connection portion specifying unit 221 specifies a connection portion from the information input by the user via the input unit 20. For example, the user designates a connection portion by pointing the drill hole information 501 on the layout information (FIG. 3) displayed on the UI on the monitor 113. Alternatively, the connection portion specifying unit 221 specifies a connection portion from unit connection information, which is included in unit information of electronic equipment stored in the HDD 108 or external DB and is required to connect the print circuit board and a metal unit (chassis). Note that the unit connection information indicates types and materials of fasteners (including bolts, nuts, screws, and the like) as connection members used to fix the print circuit board to the metal unit (chassis) in correspondence with drill holes.

Next, the verification unit 22 instructs the pin identifying unit 222 to identify a pin (ground pin) of a connector connected to the internal ground based on the layout information and component information (S305). For example, the pin identifying unit 222 extracts a component corresponding to reference designator information, which represents "connector", from the layout information, searches signals connected to that connector for a signal indicating "ground", and identifies a pin to which the signal indicating "ground" is connected as a ground pin.

Alternatively, the pin identifying unit 222 may identify a ground pin by the following method. That is, the pin identifying unit 222 extracts all components corresponding to pieces of reference designator information in the layout information, which represent "connector", and extracts a component corresponding to component number information in the layout information, which matches that in the component information, corresponding to material information in the component information, which indicates a metal, and corresponding to component name information, which indicates "connector". Then, the pin identifying unit 222 identifies a ground pin of the extracted connector.

The verification unit 22 then instructs the discharge route calculation unit 223 to calculate a discharge route between the identified ground pin and the specified connection portion (S306), as will be described in detail later, and instructs the determination unit 224 to determine whether or not the discharge route is calculated (S307). If no discharge route is calculated, the verification unit 22 controls the process to jump to step S309. If the discharge route is calculated, the verification unit 22 instructs the determination unit 224 to determine whether or not an active component or a conductive pattern other than the ground pattern (to be referred to as a non-ground pattern hereinafter) exists on the discharge route (S308). If such active component or non-ground pattern does not exist, the verification unit 22 controls the process to jump to step S310.

If no discharge route is calculated, or if an active component or non-ground pattern exists on the discharge route, the verification unit 22 instructs the output unit 23 to output the determination result (S309). Note that if neither an active component nor a non-ground pattern exists on the discharge route, the verification unit 22 may output a determination result indicating it.

If no event occurs, if the layout information is not changed, if neither an active component nor a non-ground pattern exists on the discharge route, or if the determination result is output, the verification unit 22 determines whether or not the layout design of the print circuit board is complete (S310). If the layout design is complete, the verification unit 22 ends processing; otherwise, it controls the process to return to step S301.

Discharge Route Calculation Unit

The processing (S306) of the discharge route calculation unit 223 will be described below with reference to the flowchart shown in FIG. 5.

The discharge route calculation unit 223 compares the signal name of a signal connected to the ground pin and that of the external ground electrically connected to the connection portion with reference to the layout information, and determines whether or not the two signal names match (S401). If the two signal names match, the discharge route calculation unit 223 decides a route (shortest route) having a smallest distance between the ground pin and connection portion (S402), and controls the process to jump to step S407.

An example of the shortest route decision method will be described below with reference to FIG. 6. For example, assuming that a pin 503 at the right end of a connector 502 is the ground pin, and a lower right drill hole 501 is the connection portion, a line segment 504, which connects the coordinates of the right end ground pin 503 and those of the lower right drill hole 501, is decided as the shortest route.

Also, for example, assuming that a pin 503 at the left end of the connector 502 is the ground pin, and an upper right drill hole 501 is the connection portion, a line segment, which connects the coordinates of the left end ground pin 503 and those of the lower right drill hole 501, is decided as the shortest route. Alternatively, a curve or polygonal line 505 (a minimum-impedance route that connects the ground pin and connection portion), which connects the coordinates of the left end ground pin 503 and upper right drill hole 501, may be decided as the shortest route based on a wiring pattern indicating a shape of a conductor pattern in the layout information. Alternatively, a creepage route of the print circuit board may be decided as the shortest route.

On the other hand, when, for example, an impedance element is laid out between the ground pin of the connector and the external ground, a signal name of the ground pin may be different from that of a ground pattern 500. In this case, discharge route calculation unit 223 extracts a passive component (passive element), which has a pin (first pin) to which a signal having the same signal name as the signal connected to the ground pin is connected, and is laid out at a position closest to the ground pin, with reference to the layout information (S403). Then, the discharge route calculation unit 223 compares the signal name of a signal connected to a pin (second pin) different from the first pin of that component with that of the internal ground electrically connected to the connection portion with reference to the layout information, and determines whether or not the two signal names match (S404).

If the signal name of the second pin does not match that of the internal ground electrically connected to the connection portion, the discharge route calculation unit 223 ends the processing as a discharge route calculation error. If these signal names match, the discharge route calculation unit 223 decides a shortest route between the ground pin and the first pin (S405), and decides a shortest route between the second pin and the connection portion (S406), as in step S402. In this way, a discharge route of DC components and low-frequency AC components of discharge currents of static electricity is formed while avoiding a portion other than conductors on the print circuit board.

Another example of the shortest route decision method will be described below with reference to FIG. 7. For example, assuming that a pin 503 at the right end of a connector 502 is the ground pin, a lower left drill hole 501 is the connection portion, and a component 506 is the passive component extracted in step S403, line segments 507 and 508 are decided as shortest routes. Of course, based on a wiring pattern, minimum-impedance routes may be decided as shortest routes 509 and 510. Note that FIG. 7 illustrates a case of only one passive component 506 which connects a conductive pattern to which the ground pin is connected, and the ground pattern 500. The discharge route calculation unit 223 can calculate routes via a plurality of passive components, and a plurality of routes may be calculated.

Next, the discharge route calculation unit 223 stores information indicating the decided shortest route as a discharge route of DC components and low-frequency AC components (to be also referred to as "DC/low-frequency discharge route" hereinafter) in a predetermined area of a memory such as the RAM 102 (S407), thus ending the processing. Note that a discharge route may be expressed by a pattern of a line segment or arc having no width, or by a pattern such as a line segment or arc having a width.

Determination Unit

The determination process (S308) of the existence of a component/conductive pattern on the discharge route by the determination unit 224 is attained with reference to the layout information by checking, for example, whether or not the discharge route overlaps an outline of a component indicated by a shape of a mounted component, and whether or not the discharge route and non-ground pattern overlap each other. For example, in the layout shown in FIG. 7, this determination process is attained by checking whether or not a discharge route 508 (or 510) overlaps the outline of an active component 511, and whether or not a discharge route 507 (or 509) overlaps one of conductive patterns 512.

Display of Determination Result

A display example of the determination result will be described below with reference to FIGS. 8A and 8B. When an active component or non-ground pattern exists on the discharge route, as shown in FIG. 7, the output unit 23 outputs display contents shown in FIG. 8A. That is, the output unit 23 displays discharge routes 507 and 508 on a layout screen of the print circuit board, and also displays an active component 511 and conductive patterns 512 which exist on the discharge routes, so as to be visually recognized by the user.

Figures 8A, 8B:
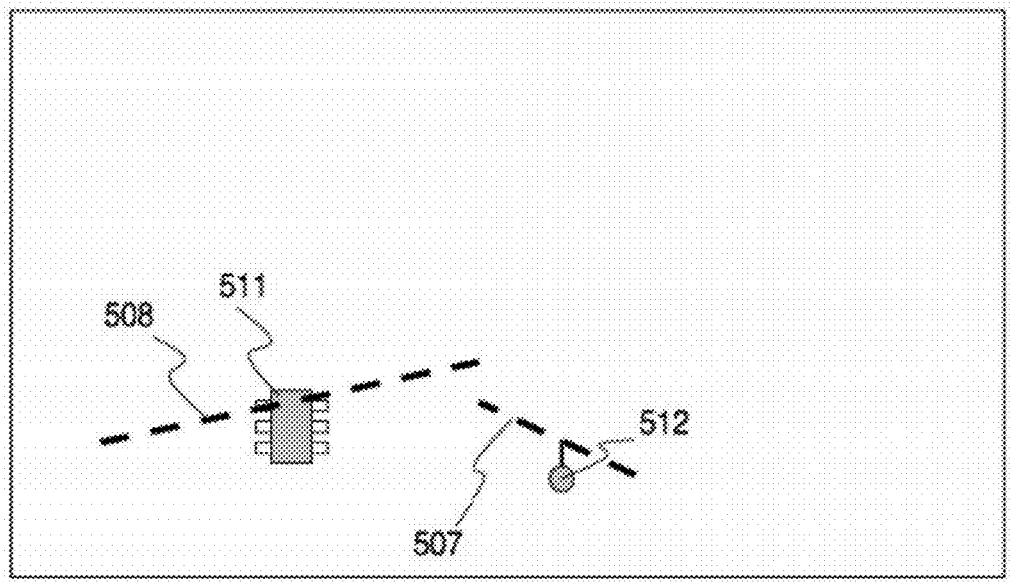
FIGS. 8A and 8B are views for explaining a display example of a determination result.

Alternatively, the output unit 23 may display the determination result in a table format shown in FIG. 8B. FIG. 8B shows an example in which an active component (component of determination NG) which exists on a discharge route, a signal name (signal name of determination NG) of a conductive pattern, and a wiring length of the conductive pattern in the discharge route are displayed in association with a connector CN001 having the ground pin. Of course, when the user selects the component or signal name of determination NG by clicking on the displayed result, the selected component or the conductive pattern corresponding to the selected signal name is displayed using highlight display, zoom-up display, or popup display on the layout screen so as to be visually recognized.

When no discharge route is calculated, the output unit 23 displays a message indicating "discharge route calculation error", and stores information required to display the above determination result in, for example, a predetermined area of a memory such as the RAM 102 or HDD 108.

In this manner, a discharge route of static electricity caused by electrostatic noise, and an active component and conductive pattern, which exist on the discharge route, can be visualized. Therefore, the user can recognize the discharge route in the design stage of a print circuit board, and can attain layout design by avoiding a component layout on the discharge route and wiring of a conductive pattern on the discharge route. That is, the design support apparatus required to execute component layout and writing processes on a print circuit board insusceptible to the influence of electrostatic noise which flows in through a connector can be provided.

For example, the active component 511 shown in FIG. 8A is laid out on the discharge route. The user changes a layout to displace the active component 511 from the discharge route with reference to the displayed result. Also, since the discharge route depends on a relative positional relationship between the connection portion and ground pin, the user may change a layout to displace the discharge route from the active component 511 by changing the positions of the connection portion and ground pin.

Second Embodiment

Design support processing according to the second embodiment of the present invention will be described below. Note that the same reference numerals in the second embodiment denote the same components as those in the first embodiment, and a detailed description thereof will not be given.

The first embodiment has explained the design support processing which verifies the influence of electrostatic noise in association with a layout of a print circuit board whose design is underway. The second embodiment will explain design support processing which verifies the influence of electrostatic noise in association with a layout of a print circuit board after design.

In the second embodiment, the input unit 20 can input information associated with conditions of verification processing (to be referred to as verification conditions hereinafter), which are input by the user by operating the input device 111, to the verification unit 22 in addition to various instructions and data which are input by the user by operating the input device 111. Based on the input verification conditions, the connection portion specifying unit 221 specifies a connection portion, the pin identifying unit 222 identifies a ground pin, and the discharge route calculation unit 223 calculates a discharge route.

Verification Processing

Figure 9:
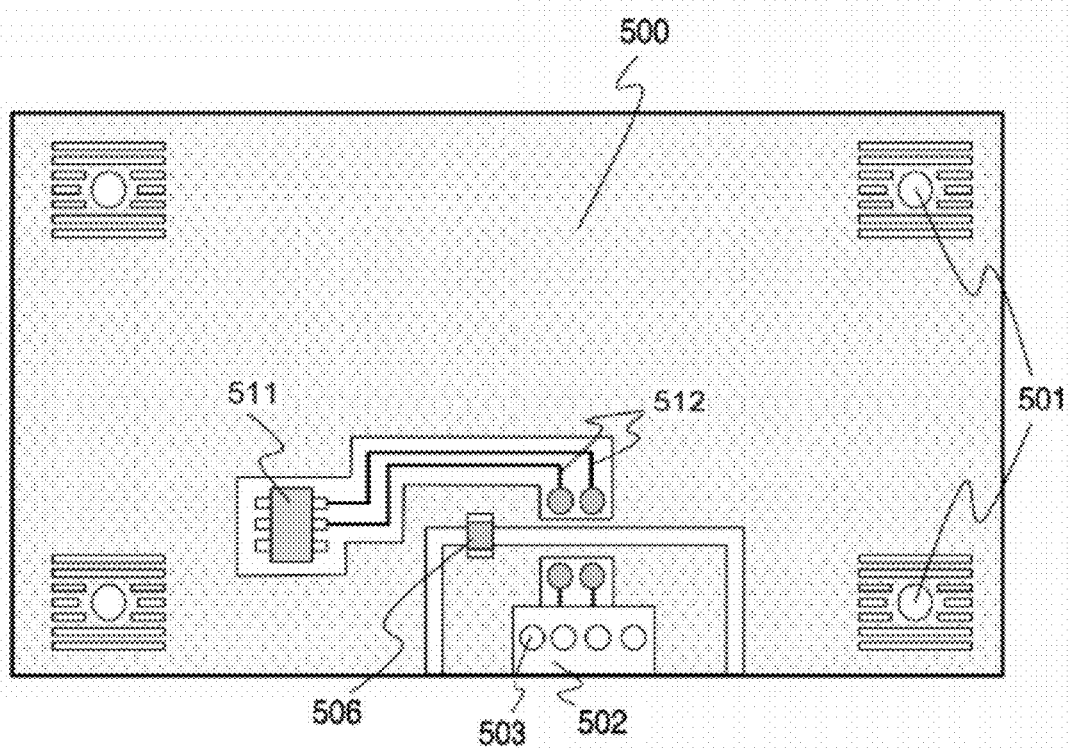
FIG. 9 shows an example of layout information of a print circuit board according to the second embodiment.

FIG. 9 shows an example of layout information of a print circuit board. The print circuit board shown in FIG. 9 is in a state in which the layout processes of components and conductive patterns are complete. That is, the layout information includes ground pattern information 500, drill hole information 501, connector shape information 502, mounted component information 503 indicating pins of a connector, pieces of shape information 506 and 511 of components, and wiring information 512 of conductive patterns. Note that a component 511 is an IC (active component), a component 506 is a passive component, and conductive patterns 512 are wirings, which connect the pins of a connector 502 and those of the IC 511. The layout information shown in FIG. 9 is displayed on the UI on the monitor 113 by the CAD program.

Figure 10:
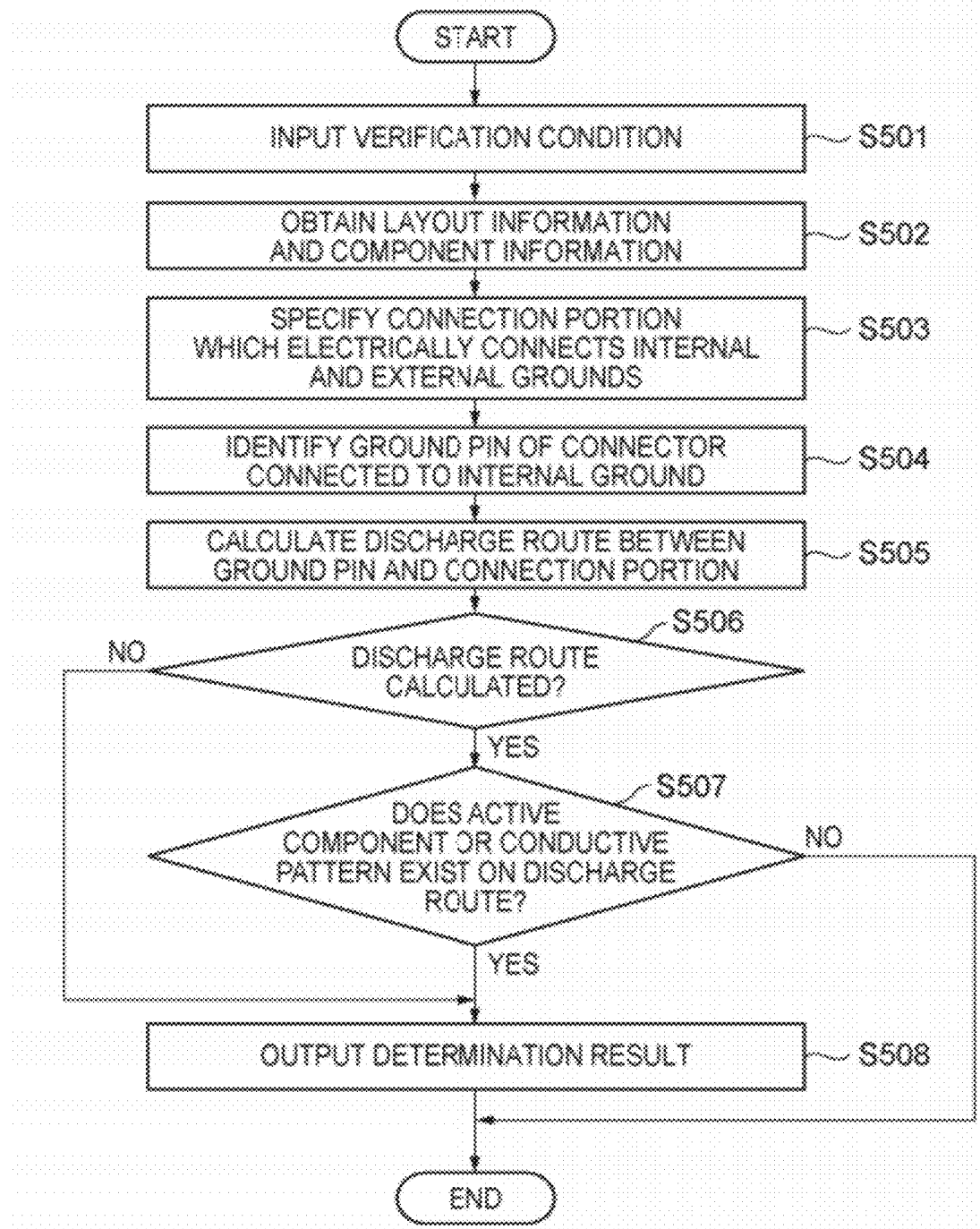
FIG. 10 is a flowchart for explaining processing of a verification unit.

The processing of the verification unit 22 will be described below using the flowchart shown in FIG. 10 with reference to the layout information shown in FIG. 9.

Upon reception of an execution instruction of verification processing via the input unit 20, the verification unit 22 inputs the verification conditions (S501). The verification conditions include information indicating a reference designator of a connector to be verified, specific number information, and the like, and information required to specify a connection portion, and the like. Furthermore, the verification conditions may include a width of a discharge route, a desired verification range from an end of a print circuit board, a length (wiring inhibition length) of a conductive pattern, which length yields NG determination of a conductive pattern that exists on the discharge route, and the like, upon calculation of a discharge route.

The verification unit 22 instructs the information extraction unit 21 to obtain the layout information and component information (S502) as in step S302 in the first embodiment. Then, as will be described in detail later, the verification unit 22 instructs the connection portion specifying unit 221 to specify a connection portion which electrically connects between the internal and external grounds based on the layout information and verification conditions (S503). Subsequently, the verification unit 22 instructs the pin identifying unit 222 to identify a ground pin in association with a connector to be verified indicated by the verification conditions (S504), as in step S305 in the first embodiment.

The verification unit 22 then instructs the discharge route calculation unit 223 to calculate a discharge route between the identified ground pin and the specified connection portion (S505), as will be described in detail later, and instructs the determination unit 224 to determine whether or not the discharge route is calculated (S506). If no discharge route is calculated, the verification unit 22 controls the process to jump to step S508. If the discharge route is calculated, the verification unit 22 instructs the determination unit 224 to determine whether or not an active component or a conductive pattern other than the ground pattern (non-ground pattern) exists on the discharge route (S507), as in step S308 in the first embodiment. If such active component or non-ground pattern does not exist, the verification unit 22 ends the processing.

If no discharge route is calculated, or if an active component or non-ground pattern exists on the discharge route, the verification unit 22 instructs the output unit 23 to output the determination result (S508) as in step S309 in the first embodiment, thus ending the processing. Note that if neither an active component nor a non-ground pattern exists on the discharge route, the verification unit 22 may output a determination result indicating it.

Connection Portion Specifying Unit

Figure 11:
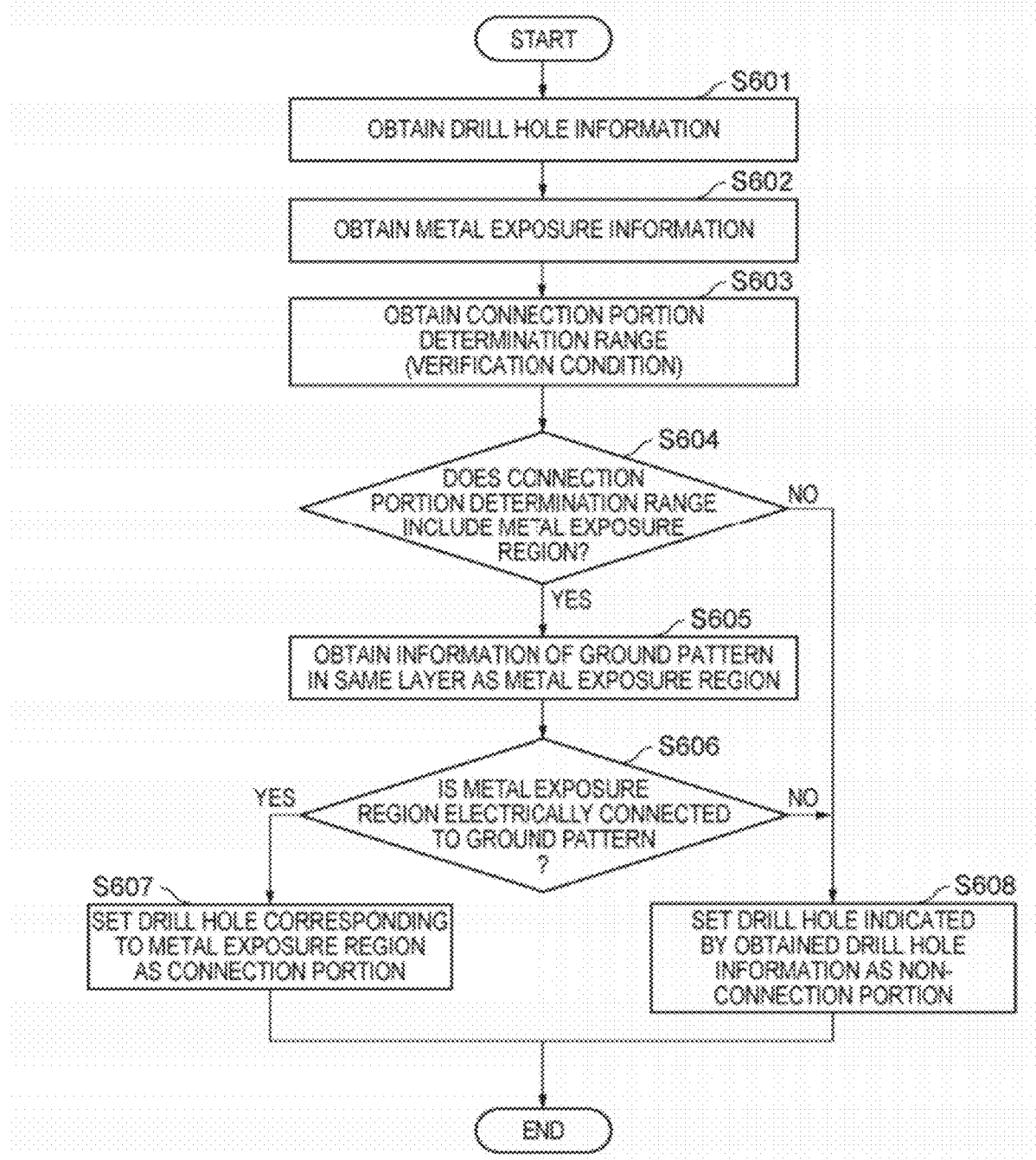
FIG. 11 is a flowchart for explaining processing of a connection portion specifying unit.

The processing (S503) of the connection portion specifying unit 221 will be described below with reference to the flowchart shown in FIG. 11.

The connection portion specifying unit 221 obtains drill hole information from the layout information (S601), obtains metal exposure information from the layout information (S602), and obtains a connection portion specifying range input by the user as the verification conditions (S603).

Figure 12:
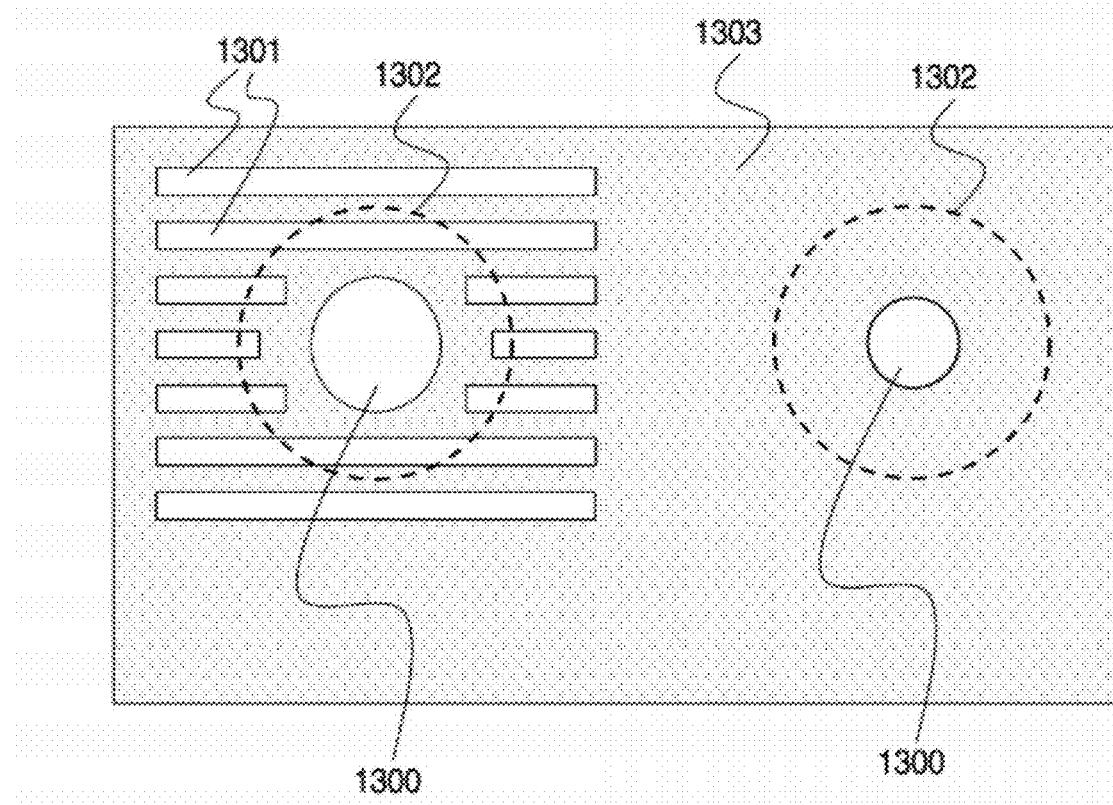
FIG. 12 is a view for explaining a relationship among drill hole information, metal exposure information, and a connection portion specifying range.

The relationship among the drill hole information, metal exposure information, and connection portion specifying range will be described below with reference to FIG. 12. FIG. 12 shows pieces of drill hole information 1300, metal exposure regions 1301, connection portion specifying ranges 1302, and a ground pattern 1303. The connection portion specifying unit 221 determines whether or not the connection portion specifying range 1302 includes metal exposure regions 1301 (S604), and if the connection portion specifying range 1302 does not include any metal exposure region 1301, the connection portion specifying unit 221 controls the process to advance to step S608.

FIG. 12 exemplifies a case in which the interior of a circle having a radius designated by the user from the center of each drill hole, is defined as the connection portion specifying range 1302. However, a shape of the connection portion specifying range 1302 is arbitrary. That is, the connection portion specifying unit 221 attains the determination process in step S604 by checking whether or not coordinates and angles of respective points (to be referred as configuring elements hereinafter) of a pattern such as a line or arc, which represents a shape of the connection portion specifying range 1302, overlap configuring elements of shapes of the metal exposure regions 1301 as patterns.

If the connection portion specifying range 1302 includes the metal exposure regions 1301, the connection portion specifying unit 221 obtains information of the ground pattern 1303 of the same layer as the metal exposure regions 1301 with reference to the layout information (S605). Then, the connection portion specifying unit 221 determines whether or not the metal exposure regions 1301 included in the connection portion specifying range 1302 are electrically connected to the ground pattern 1303 (S606). If they are not electrically connected, the connection portion specifying unit 221 controls the process to advance to step S608.

The connection portion specifying unit 221 determines connections between the metal exposure regions 1301 and ground pattern 1303 by checking whether or not the configuring elements of a shape of the ground pattern 1303 overlap those of the shapes of the metal exposure regions 1301 as patterns. If they are connected, the connection portion specifying unit 221 sets a drill hole corresponding to the metal exposure regions 1301 included in the connection portion specifying range 1302 as a connection portion (S607), thus ending the processing.

If the connection portion specifying range 1302 does not include any metal exposure region or if the metal exposure regions 1301 are not connected to the ground pattern 1303, the connection portion specifying unit 221 sets a drill hole indicated by the obtained drill hole information as a non-connection portion (S608), thus ending the processing.

Discharge Route Calculation Unit

Figure 13:
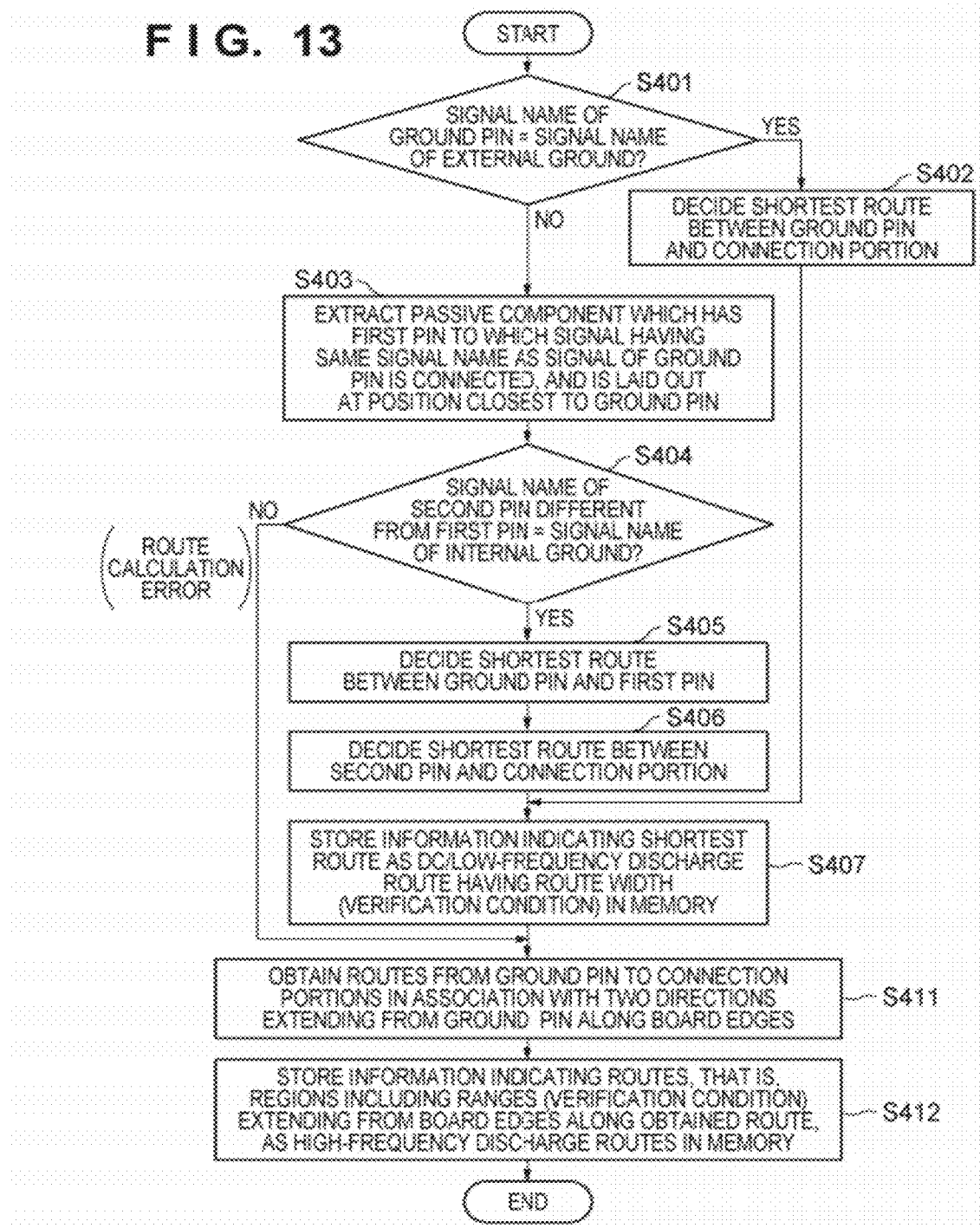
FIG. 13 is a flowchart for explaining processing of a discharge route calculation unit.

The processing (S505) of the discharge route calculation unit 223 will be described below with reference to the flowchart shown in FIG. 13. Note that processes in steps S401 to S407 are the same as those in the first embodiment, and a detailed description thereof will not be given. However, in step S407, the discharge route calculation unit 223 stores information indicating the decided shortest route as that of DC components and low-frequency AC components having a route width set in the verification conditions in a predetermined area of a memory such as the RAM 102. If a discharge route calculation error has occurred in step S404, the discharge route calculation unit 223 controls the process to jump to step S411.

Figure 14:
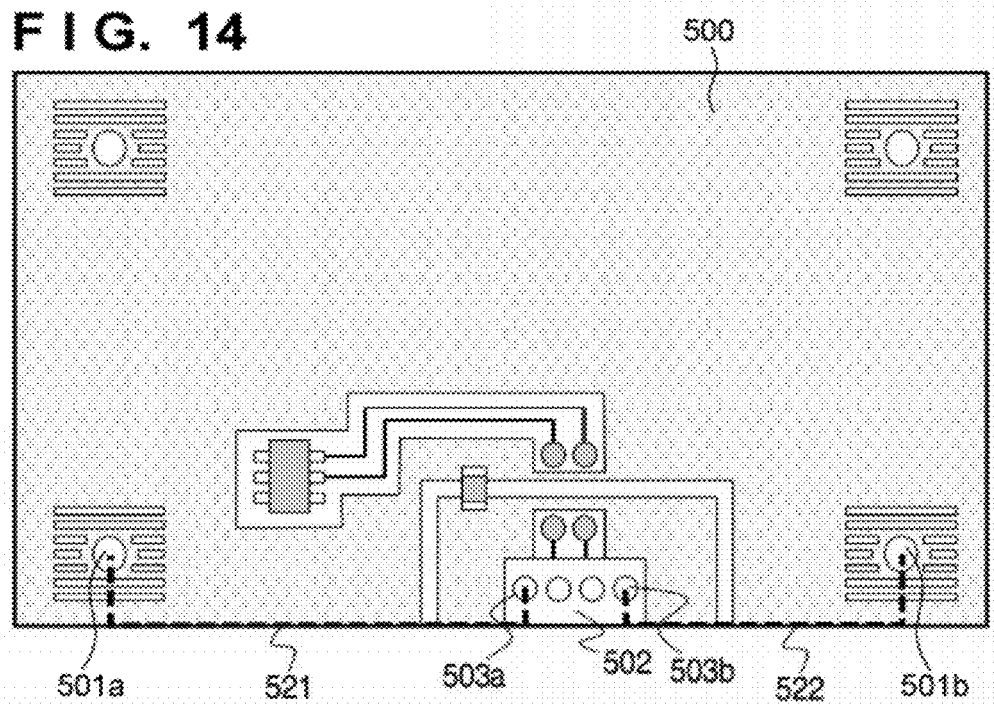
FIG. 14 is a view for explaining a route obtaining method.

The discharge route calculation unit 223 obtains routes from a ground pin to connection portions in association with two directions extending from the ground pin along board edges (S411). A route obtaining method will be described below with reference to FIG. 14. For example, when ground pins 503a and 503b are available, a combination of a line segment which connects the ground pin 503a and a board edge closest to the ground pin 503a, a line segment which connects a connection portion 501a and a board edge closest to the connection portion 501a, and a line segment which connects the two board edges is obtained as a route 521. Likewise, a combination of a line segment which connects the ground pin 503b and a board edge closest to the ground pin 503b, a line segment which connects a connection portion 501b and a board edge closest to the connection portion 501b, and a line segment which connects the two board edges is obtained as a route 522.

Figure 15:
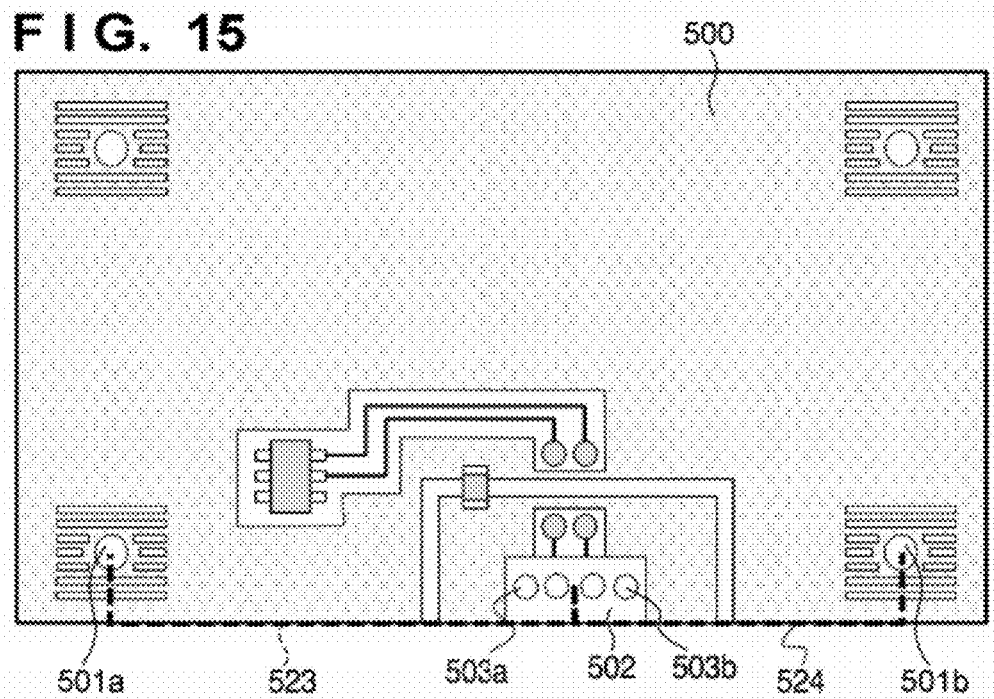
FIG. 15 is a view for explaining another route obtaining method.

Another route obtaining method will be described below with reference to FIG. 15. For example, a combination of a line segment which connects the center of a connector 502 and a board edge closest to the center, a line segment which connects a connection portion 501a and a board edge closest to the connection portion 501a, and a line segment which connects the two board edges is obtained as a route 523. Likewise, a combination of a line segment which connects the center of the connector 502 and a board edge closest to the center, a line segment which connects a connection portion 501b and a board edge closest to the connection portion 501b, and a line segment which connects the two board edges is obtained as a route 524.

Note that an example in which the board edge is obtained as a route has been explained. Alternatively, an edge of a region such as a wiring region along an outline of a circuit board may be obtained as a route.

Next, the discharge route calculation unit 223 stores information indicating routes, that is, regions which extend along the obtained routes and include ranges from the board edges set in the verification conditions as discharge routes of high-frequency AC components in a predetermined area of a memory such as the RAM 102 (S412), thus ending the processing. Note that the discharge routes of high-frequency AC components will also be referred to as "high-frequency discharge routes" hereinafter. In this manner, the discharge routes of high-frequency AC components of discharge currents of static electricity are formed on conductors of print circuit board edges to extend across slits.

Figure 16:
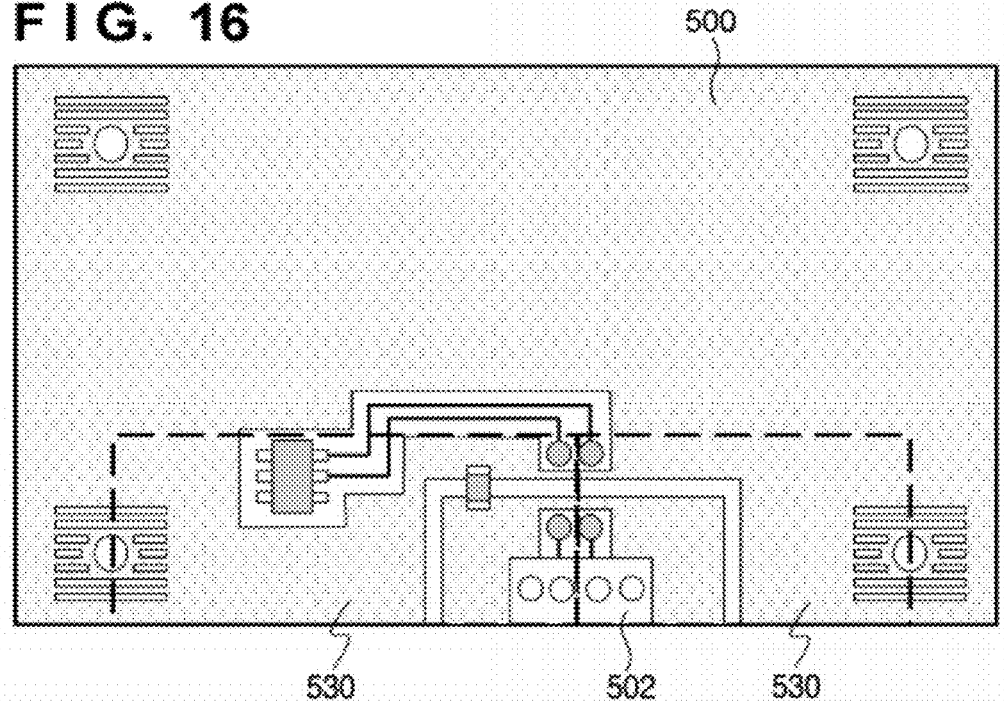
FIG. 16 is a view showing an example of discharge routes of high-frequency AC components.

FIG. 16 shows an example of the discharge routes of high-frequency AC components. As shown in FIG. 16, regions 530, which are obtained by expanding the obtained routes to ranges from the board edges set in the verification conditions, that is, to the inner side of the print circuit board, are the discharge routes of high-frequency AC components.

Figure 17:
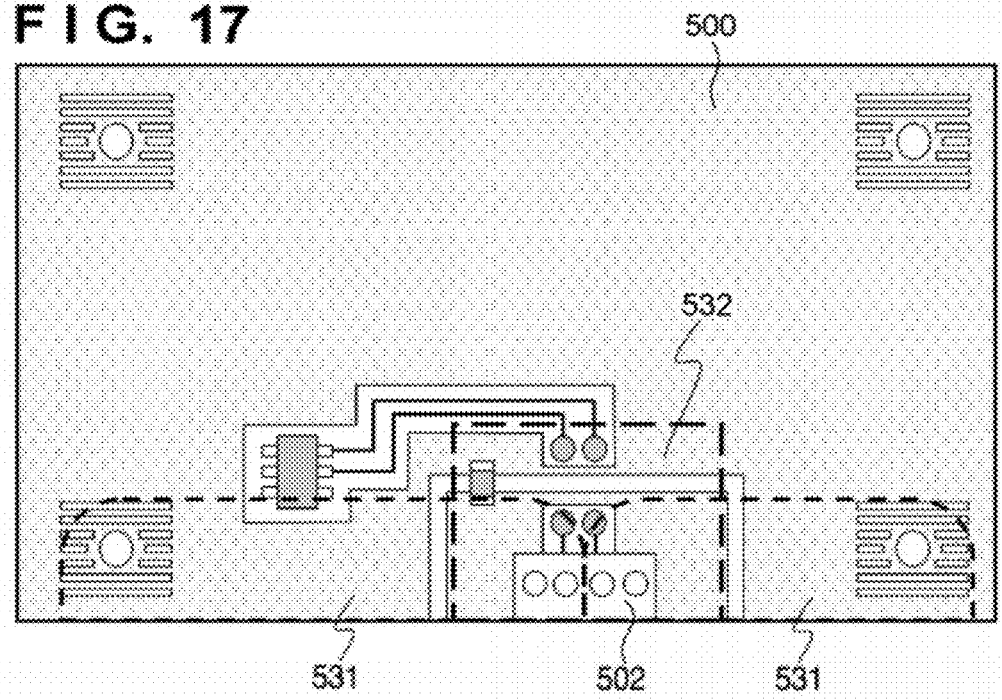

FIG. 17 shows another example of the discharge route of high-frequency AC components. As shown in FIG. 17, regions 531, which are obtained by expanding the obtained routes to, for example, ranges from the board edges set in the verification conditions, and rounding vertices of the expanded regions within the print circuit board, may be set as the discharge routes of high-frequency AC components. Furthermore, in order to perform verification over a broad range around the connector 502, a region 532 obtained by multiplying an area (an occupying area of a board surface) of the connector 502 by a predetermined coefficient may be added to the discharge routes. That is, a region indicated by a pattern obtained by combining the regions 531 and 532 may be set as the discharge routes.

FIG. 18 shows still another example of the discharge routes of high-frequency AC components. As indicated by the broken curves in FIG. 18, routes from a ground pin to closest connection portions are not limited to discharge routes, but routes from the ground pin to second closest connection portions via the closest connection portions may be set as the discharge routes.

Display of Determination Result

A display example of the determination result will be described below with reference to FIGS. 19A and 19B. When an active component or non-ground pattern exists on the discharge routes, as shown in, for example, FIG. 16, the output unit 23 outputs display contents shown in FIG. 19A as the determination result. That is, the output unit 23 displays discharge routes 530 on a layout screen of the print circuit board, and also displays an active component 703 and conductive pattern 704 which exist on the discharge routes 530, so as to be visually recognized by the user.

Figures 19A, 19B:
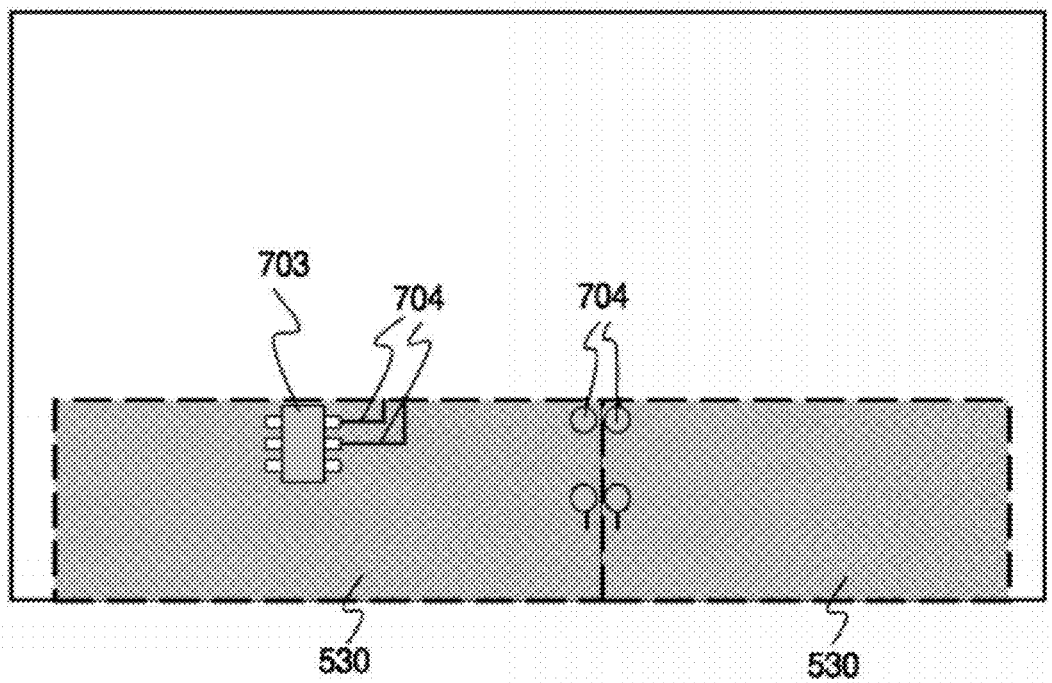
FIGS. 19A and 19B are views for explaining a display example of a determination result.

Alternatively, the output unit 23 may display the determination result in a table format shown in FIG. 19B. FIG. 19B is an example in which an active component (component of determination NG) which exists on a discharge route, a signal name (signal name of determination NG) of a conductive pattern, and a wiring length of the conductive pattern in the discharge route are displayed in association with a connector CN001 having the ground pin. Of course, when the user selects the component or signal name of determination NG by clicking on the displayed result, the selected component or the conductive pattern corresponding to the selected signal name is displayed using highlight display, zoom-up display, or popup display on the layout screen so as to be visually recognized.

When no discharge route is calculated, the output unit 23 displays a message indicating "discharge route calculation error", and stores information required to display the above determination result in, for example, a predetermined area of a memory such as the RAM 102 or HDD 108.

Correction of Layout

Figure 20:
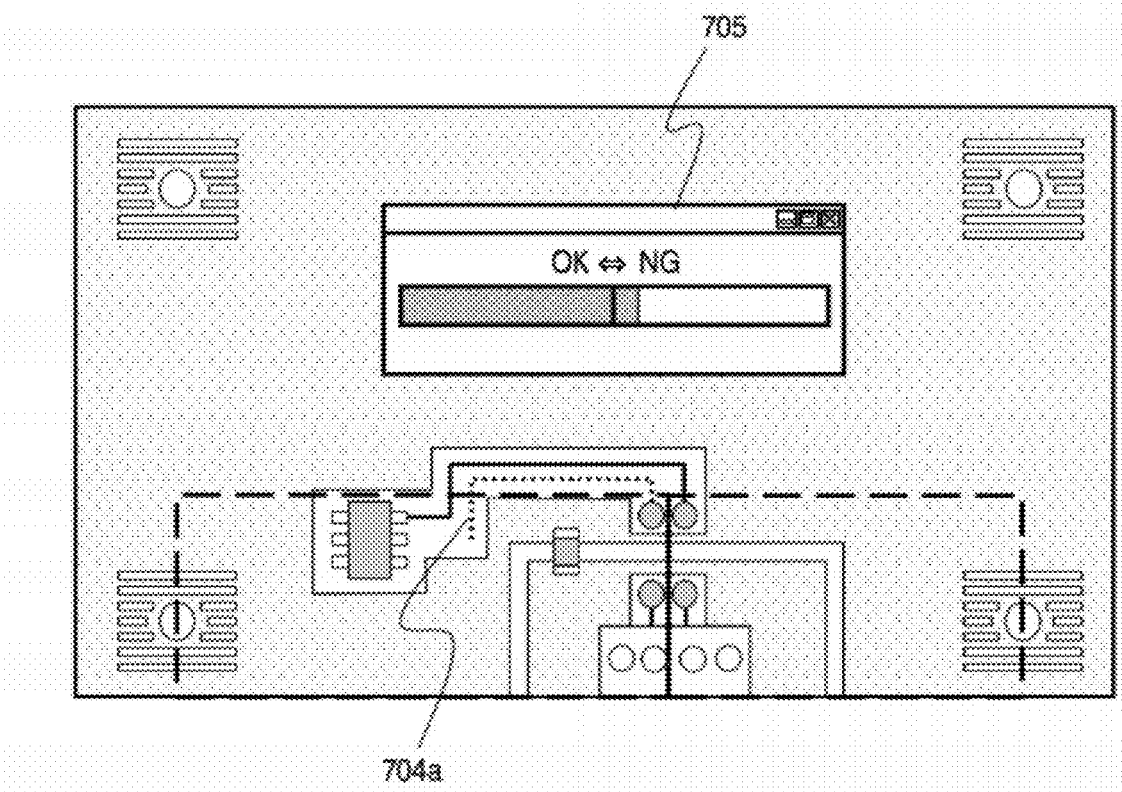
FIG. 20 is a view for explaining a display example in layout correction.

A display example in layout correction will be described below with reference to FIG. 20. FIG. 20 shows a state in which, for example, the user corrects wiring of a conductive pattern 704a with reference to the determination result shown in FIGS. 19A and 19B.

The verification unit 22 displays information associated with a length of the conductive pattern 704a wired by the user on a window 705 in real time. A bar displayed on the window 705 enters an "OK" region when the length of the conductive pattern 704a is shorter than a wiring inhibition length set as the verification conditions, and enters an "NG" region when the length of the conductive pattern 704a exceeds the wiring inhibition length.

In this manner, the discharge routes of static electricity caused by electrostatic noise, and an active component and conductive pattern which exist on the discharge routes can be visualized. Therefore, the user can recognize the discharge routes after completion of the design of a print circuit board, and can correct the active component laid out on the discharge route and the conductive pattern wired on the discharge route.

For example, the active component 703 shown in FIG. 19A is laid out on the discharge route. The user corrects the layout to displace the active component 703 from the discharge route with reference to the displayed result. Also, since each discharge route depends on a relative positional relationship between the connection portion and ground pin, the user may correct the layout to displace the discharge route from the active component 703 by changing the positions of the connection portion and ground pin.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-283735, filed Dec. 20, 2010, which is hereby incorporated by reference herein in its entirety.

What is claimed is:

1. An apparatus for supporting design of a print circuit board, comprising:
    an obtaining section, configured to obtain layout information indicating a layout of circuits on the print circuit board;
    a specifying section, configured to specify a connection portion, which electrically connects a ground pattern of the print circuit board and an external ground of the print circuit board, with reference to the layout information;
    an identifying section, configured to identify a pin, which is included in a connector laid out on the print circuit board, and is connected to the ground pattern, with reference to the layout information; and
    a first determiner, configured to determine a discharge route between the pin and the connection portion,
    wherein the specifying section comprises:
    an acquiring unit configured to acquire information indicating a drill hole, information indicating a metal exposure region, and information indicating a specifying range of the connection portion;
    a determining unit configured to determine whether or not the metal exposure region and the ground pattern overlap each other within the specifying range of the connection portion around the drill hole on the print circuit board; and
    a setting unit configured to set the drill hole as the connection portion if it is determined that the metal exposure region and the ground pattern do overlap each other, and to set the drill hole as a non-connection portion if it is determined that the metal exposure region and the ground pattern do not overlap each other.

2. The apparatus according to claim 1, further comprising:
    a second determiner, configured to determine, with reference to the layout information, whether or not an active element and a conductive pattern other than the ground pattern exist on the calculated discharge route; and
    an outputting section, configured to output a determination result of the second determiner.

3. The apparatus according to claim 2, wherein when the active element or the conductive pattern exists on the discharge route, the outputting section outputs a warning message that advises accordingly.

4. The apparatus according to claim 2, wherein the outputting section displays the discharge route on a monitor.

5. The apparatus according to claim 1, wherein the verification condition includes information indicating a width of the discharge route.

6. The apparatus according to claim 1, wherein the first determiner compares a signal name of the pin connected to the ground pattern, and a signal name of the ground pattern, determines a shortest route between the pin and the connection portion as the discharge route when the two signal names match, or extracts a passive element which electrically connects the pin and the ground pattern, and determines a route extending from the pin to the connection portion via the passive element as the discharge route when the two signal names do not match.

7. The apparatus according to claim 1, wherein the first determiner determines a route which extends from the pin connected to the ground pattern to the connection portion along an edge of the print circuit board as the discharge route.

8. A method of supporting design of a print circuit board, the method comprising:
    using a processor to perform the steps of:
    obtaining layout information indicating a layout of circuits on the print circuit board;
    specifying a connection portion, which electrically connects a ground pattern of the print circuit board and an external ground of the print circuit board, with reference to the layout information;
    identifying a pin, which is included in a connector laid out on the print circuit board, and is connected to the ground pattern, with reference to the layout information; and
    determining a discharge route between the pin and the connection portion,
    wherein the specifying step comprises the steps of:
    acquiring information indicating a drill hole, information indicating a metal exposure region, and information indicating a specifying range of the connection portion;
    determining whether or not the metal exposure region and the ground pattern overlap each other within the specifying range of the connection portion around the drill hole on the print circuit board;
    setting the drill hole as the connection portion if it is determined that the metal exposure region and the ground pattern do overlap each other; and
    setting the drill hole as a non-connection portion if it is determined that the metal exposure region and the ground pattern do not overlap each other.

9. A non-transitory computer readable medium storing a computer-executable program for causing a computer to perform a method of supporting design of a print circuit board, the method comprising the steps of:
    obtaining layout information indicating a layout of circuits on the print circuit board;
    specifying a connection portion, which electrically connects a ground pattern of the print circuit board and an external ground of the print circuit board, with reference to the layout information;
    identifying a pin, which is included in a connector laid out on the print circuit board, and is connected to the ground pattern, with reference to the layout information; and
    determining a discharge route between the pin and the connection portion, wherein the specifying step comprises the steps of:
acquiring information indicating a drill hole, information indicating a metal exposure region, and information indicating a specifying range of the connection portion;
determining whether or not the metal exposure region and the ground pattern overlap each other within the specifying range of the connection portion around the drill hole on the print circuit board;
setting the drill hole as the connection portion if it is determined that the metal exposure region and the ground pattern do overlap each other; and
setting the drill hole as a non-connection portion if it is determined that the metal exposure region and the ground pattern do not overlap each other.

* * * * *